United States Patent [19]
Akita

[11] Patent Number: 5,541,940
[45] Date of Patent: Jul. 30, 1996

[54] ERROR CORRECTION METHOD AND ERROR CORRECTION CIRCUIT

[75] Inventor: Mamoru Akita, Kanagawa, Japan

[73] Assignee: Sony Corporation, Tokyo, Japan

[21] Appl. No.: 290,886

[22] PCT Filed: Dec. 22, 1993

[86] PCT No.: PCT/JP93/01054

§ 371 Date: Nov. 18, 1994

§ 102(e) Date: Nov. 18, 1994

[87] PCT Pub. No.: WO94/15406

PCT Pub. Date: Jul. 7, 1994

[30] Foreign Application Priority Data

Dec. 25, 1992 [JP] Japan ................... 4-358256

[51] Int. Cl.⁶ .................................. G06F 11/10
[52] U.S. Cl. ................................ 371/49.1; 371/5.1
[58] Field of Search ............... 371/49.1, 48, 25.1, 371/67.1, 49.2, 5.1, 37.2, 5.3

[56] References Cited

U.S. PATENT DOCUMENTS

| | | | |
|---|---|---|---|
| 4,312,069 | 1/1982 | Ahamed | 371/37 |
| 4,488,302 | 12/1984 | Ahamed | 371/40 |
| 4,541,093 | 9/1985 | Furuya et al. | |
| 4,860,272 | 8/1989 | Nishikawa et al. | |
| 5,046,037 | 9/1991 | Cognault et al. | |
| 5,099,484 | 3/1992 | Smelser | |

FOREIGN PATENT DOCUMENTS

| | | |
|---|---|---|
| 0154538 | 9/1985 | European Pat. Off. |
| 0333599 | 9/1989 | European Pat. Off. |
| 0341862 | 11/1989 | European Pat. Off. |
| 62-137924 | 6/1987 | Japan |
| 4-29414 | 1/1992 | Japan |

Primary Examiner—Robert W. Beausoliel, Jr.
Assistant Examiner—Phung M. Chung
Attorney, Agent, or Firm—William S. Frommer; Alvin Sinderbrand

[57] ABSTRACT

An error correction method comprises the steps of loading a value stored in a syndrome register (15) to syndrome registers (16) to (18) if error is a single-error after syndrome registers [S0 to S3] (15) to (18) had finished calculating syndromes and loading values stored in the syndrome registers (16) to (18) to data registers [R1 to R3] (22) to (24), repeating multiplications of powers of $\alpha$, $\alpha^2$, $\alpha^3$ by using the syndrome registers (15) to (18) until coincidence detecting circuits (25) to (28) detect that the values of the syndrome registers (15) to (18) and the values of the data registers (22) to (24) are agreed, energizing a counter (29) in synchronism with the multiplications of powers, setting a count value obtained when it is detected that the values of the syndrome registers and the values of the data registers are agreed to a data location and effecting error correction based on the value of the syndrome register [S0] (15) used as an error amount.

10 Claims, 5 Drawing Sheets

ERROR CORRECTION METHOD AND ERROR CORRECTION CIRCUIT

TECHNICAL FIELD

The present invention relates to an error correction method and an error correction circuit and, particularly to an error correction method and an error correction circuit for use in error correction in digital data processing apparatus, such as reproducing apparatus for reproducing a CD (compact disc) and a DAT (digital audio tape) or the like.

BACKGROUND ART

An error correction code of CD is formed by interleaving 2-stage Reed-Solomon codes and referred to as CIRC (Cross Interleaved Reed-Solomon Code). The 2-stage Reed-Solomon codes used in the CIRC are referred to as C1, C2, respectively.

When error is corrected by the C1 code, for example, error-correction is carried out at the unit of 32 byte-data in which 4-byte parity data are added to 28-byte data. The 32-byte data are referred to as $x_0$ to $x_{31}$, respectively.

4-byte parity data are selected such that all of four equations on [Equation 1] yield "0"s:

$$\begin{cases} x_0 + x_1 & +\ldots + x_i & +\ldots + x_{31} & = 0 \\ x_0 + x_1\alpha & +\ldots + x_i\alpha^i & +\ldots + x_{31}\alpha^{31} & = 0 \\ x_0 + x_1\alpha^2 & +\ldots + x_i\alpha^{2i} & +\ldots + x_{31}\alpha^{62} & = 0 \\ x_0 + x_1\alpha^3 & +\ldots + x_i\alpha^{3i} & +\ldots + x_{31}\alpha^{93} & = 0 \end{cases} \quad (1)$$

Data thus generated are recorded on the disc, and recorded data contains error due to various causes when reproduced.

Data (data containing errors) received by an error correction circuit after they had been read out from the disc are respectively referred to as $x_0'$ to $x_{31}'$ in order that they can be distinguished from data recorded on the disc.

When error correction is implemented in actual practice, data is received and then syndromes S0 to S3 are calculated based on [Equation 2]:

$$\begin{cases} S0 = & x_0' + x_1' & +\ldots + x_i' & +\ldots + x_{31}' \\ S1 = & x_0' + x_1'\alpha & +\ldots + x_i'\alpha^i & +\ldots + x_{31}'\alpha^{31} \\ S2 = & x_0' + x_1'\alpha^2 & +\ldots + x_i'\alpha^{2i} & +\ldots + x_{31}'\alpha^{62} \\ S3 = & x_0' + x_1'\alpha^3 & +\ldots + x_i'\alpha^{3i} & +\ldots + x_{31}'\alpha^{93} \end{cases} \quad (1)$$

Galois field theorem proved that there exists a finite field having $2^8$ elements. This finite field is expressed as $GF(2^8)$.

Codes used in the CD are defined by generator polynomial on [Equation 3]:

$$P(x) = x^8 + x^4 + x^3 + x^2 + 1 \quad (3)$$

Then, $\alpha$ is a root of equation established when $P(x)=0$.

Study of [Equation 2] reveals that, if received data contains no error, then $S0=S1=S2=S3=0$ (parity data are added for this reason). Conversely, if any one of syndromes were not "0", data error could be detected.

Although the syndrome should be calculated based on the [Equation 2] prior to the error correction, if the syndromes were calculated as described above, then the number of calculation would be increased.

Therefore, [Equation 2] is modified as [Equation 4]:

$$\begin{cases} S0 = & x_0' + x_1' + \ldots + \\ S1 = & x_0' + \alpha(x_1' + \ldots + \alpha(x_2' + \ldots + \alpha(x_{30}' + \alpha(x_{31}'))\ldots)) \\ S2 = & x_0' + \alpha^2(x_1' + \alpha^2(x_2' + \ldots + \alpha^2(x_{30}' + \alpha^2(x_{31}'))\ldots)) \\ S3 = & x_0' + \alpha^3(x_1' + \alpha^3(x_2' + \ldots + \alpha^3(x_{30}' + \alpha^3(x_{31}'))\ldots)) \end{cases} \quad (4)$$

The syndrome S1, for example, can be calculated in accordance with an algorithm shown in FIG. 3. Other syndromes S0, S2, S3 also can similarly be calculated by changing a predetermined power of $\alpha$ variously.

This calculation can be implemented by a circuit composed of an adder 41 supplied at one input thereof with received data, a register 42 for storing added data from the adder 41 and a multiply-by-power $\alpha$ circuit 43 for multiplying data stored in the register 42 with power $\alpha$ and supplying multiplied data to the other input of the adder 41 as shown in FIG. 4.

In FIG. 4, received data are input to the circuit in the sequential order from the data $x_{31}'$ under the condition that the register 42 is reset. Then, the value that was generated from the register 42 when the data $x_0'$ is input becomes the value of the syndrome S1.

Because the syndromes S0, S2, S3 are required in actual practice, as shown in FIG. 5, the syndromes are calculated by four registers $42_0$ to $42_3$.

The multiply-by-power $\alpha$ circuit 43 and the adder 41 can easily be realized by a combination of exclusive-OR (EX-OR) gates based on features of Galois field as shown in FIGS. 6 and 7.

It is important to detect an error amount prior to the error correction. Also, up to 2-byte error can be corrected in the code used by the CD.

Heretofore, calculation for determining an error amount (0- byte, 1-byte and 2-byte or larger) is carried out after calculation of the syndromes was finished.

If the received data $x_i'$ is erroneous by an error amount $e_i'$, then the syndromes expressed by [Equation 5] are to be calculated as will easily be understood from the parity data structure.

$$\begin{cases} S0 = e_i \\ S1 = e_i\alpha^i \\ S2 = e_i\alpha^{2i} \\ S3 = e_i\alpha^{3i} \end{cases} \quad (5)$$

The error amount $e_i$ and an erroneous received data location i are calculated from the syndromes thus calculated.

Since the four equations of [Equation 5] has two unknowns, these equations can be solved with ease, e.g., based on [Equation 6]:

$$\begin{cases} \alpha^i = \dfrac{S1}{S0} \\ e_i = S0 \end{cases} \quad (6)$$

However, if received data had 2-byte error or greater, the received data would be corrected erroneously. Therefore, $e_i\alpha^{2i}$ and $e_i\alpha^{3i}$ should be calculated by using $\alpha^i$ and $e_i$ obtained from [Equation 5]. Then, it is necessary to confirm whether or not the calculated results are agreed with the syndromes S2, S3 of [Equation 5].

As described above, the conventional error correction circuit based on the above-mentioned algorithm should carry out at least one division and two multiplications when 1-byte error is corrected.

These calculations are those that are carried out on the Galois field. Since it is customary that, when the multiplication and the division are carried out on the Galois field, number to be calculated is modified in the form of power of α, it is necessary to use a ROM in which a table of exponents and a table of logarithms for such modification are stored. Moreover, a peripheral circuit becomes complex in circuit arrangement and a circuit scale is unavoidably increased.

DISCLOSURE OF INVENTION

In view of the aforesaid problem, it is an object of the present invention to provide an error correction method and an error correction circuit in which error detection and error correction can be realized by a circuit arrangement of an extremely small circuit scale.

According to a first aspect of the present invention, there is provided an error correction method which comprises the steps of calculating n (n is a positive integer) syndromes determined by the number of parity data added to received data from the received data, storing a syndrome representing an error amount of a single-error, if error is the single-error, in a single syndrome register and storing other syndromes in (n−1) syndrome registers, respectively, loading a value stored in the single syndrome register to the (n−1) syndrome registers and loading respective values stored in the (n−1) syndrome registers to (n−1) data registers, respectively, after calculation of the syndromes was ended, repeating multiplications of powers of α, . . . , $\alpha^{(n-1)}$ by using the (n−1) syndrome registers where α is a root of generator polynomial on the Galois field until it is detected that the values stored in the (n−1) syndrome registers and the values stored in the (n−1) data registers are agreed with each other, effecting counting in synchronism with the multiplication of powers, setting a count value obtained when the values are agreed with each other to a location of data containing error and setting the value stored in the single syndrome register to an error amount, and effecting error correction based on the data location and the error amount. The syndromes are calculated by syndrome registers S0, S1 to S(n−1). After the syndrome registers have finished calculating the syndromes, if error is a single-error, the value stored in the syndrome register S0 is loaded to the syndrome registers S1 to S(n−1), and values stored in the syndrome registers S1 to S(n−1) are loaded to data registers R1 to R(n−1), respectively. Multiplications of powers of α, . . . , $\alpha^{(n-1)}$ are repeated by using the syndrome registers S1 to S(n−1) until the values stored in the syndrome registers S1 to S(n−1) and the values stored in the data registers R1 to R(n−1) are agreed with each other, and count operation is effected in synchronism with the multiplications of powers. Thus, a count value obtained when it is detected that the values of the registers S1 to S(n−1) and the values of the data registers R1 to R(n−1) are agreed is set to a location of data containing error and an amount of error becomes a value of the syndrome S0.

According to a second aspect of the present invention, there is provided an error correction circuit using the error correction method according to the first aspect of the present invention. The error correction circuit comprises a syndrome register group composed of a single syndrome register for calculating syndromes from received data and storing a syndrome representing an error amount of a single-error if error is the single-error and (n−1) syndrome registers for storing other syndromes, (n−1) data registers for holding values stored in the (n−1) syndrome registers, coincidence detecting circuits for detecting whether or not the values stored in the (n−1) syndrome registers and the values stored in the (n−1) data registers are agreed with each other, and a counter being energized in synchronism with the multiplications of powers and being disabled in response to detected outputs from the coincidence detecting circuits, wherein error-correction is carried out based on a count value of the counter and the value stored in the single syndrome register. Thus, a single-error (1-byte error) can be detected and corrected by a circuit arrangement of an extremely small circuit scale composed of n syndrome registers necessary for calculating syndromes, (n−1) data registers, one counter and the coincidence detecting circuits, each of which is added to the syndrome registers.

BEST MODE FOR CARRYING OUT THE INVENTION

An embodiment of the present invention will be described below in detail with reference to the drawings.

Figure 1:
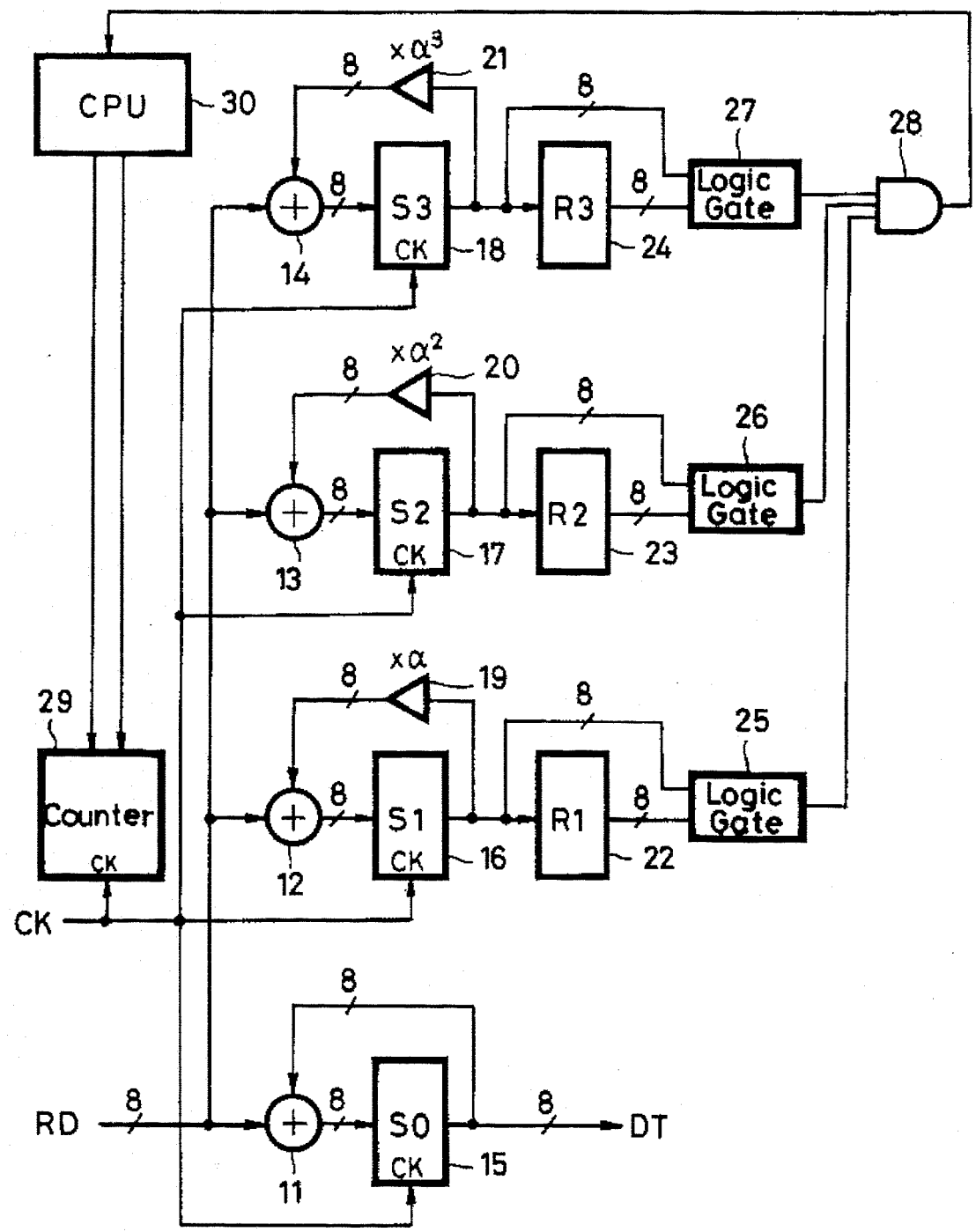
FIG. 1 is a block diagram showing an error correction circuit according to an embodiment of the present invention.

FIG. 1 is a block diagram showing an error correction circuit according to an embodiment of the present invention.

In FIG. 1, received data RD is supplied to each one input of four adders 11 to 14. Respective added data from these adders 11 to 14 are stored in four syndrome registers [S0 to S3] 15 to 18 that are used to calculate syndromes S0 to S3. The syndrome registers 15 to 18 are operated in synchronism with a clock CK supplied thereto.

Respective data stored in the syndrome registers [S1 to S3] 16 to 18 of the four syndrome registers 15 to 18 are supplied through a multiply-by-power α circuit 19, a multiply-by-power $\alpha^2$ circuit 20, a multiply-by-power $\alpha^3$ circuit 21 to other inputs of the adders 12, 13, 14 and also stored in three data registers [R1 to R3] 22 to 24, respectively.

Respective data stored in the data registers [R1 to R3] 22 to 24 are supplied to each one of inputs of three logic gates 25 to 27.

These logic gates 25 to 27 are supplied at their other inputs with respective data stored in the syndrome registers [S1 to S3] 16 to 18 and go to logic "1" level when logic values of respective corresponding bits of the two sets of registers are all agreed. Respective outputs of the logic gates 25 to 27 are supplied to respective inputs of a 3-input AND gate 28.

The AND gate 28 goes to logic "1" level when the input levels are all at logic "1" level, i.e., the outputs of the logic gate 25 to 27 are all agreed.

A counter 29 is adapted to count the same clock CK as those supplied to the four syndrome registers 15 to 18. The counter 29 is reset and disabled under the control of a CPU 30.

Specifically, when the number (location) i of erroneous data contained in received data and an error amount $e_i$ of the received data are calculated from the syndromes S0 to S3 thus obtained, the counter 29 is reset to "0" and disabled when the AND gate 28 detects that the levels of the logic gates are all agreed.

At the completion of the error calculation, the value stored in the S0 register 15 at that very ending time point becomes the error amount $e_i$ and the count value j of the counter 29 becomes the number (location) i of erroneous data. Then, received data of the error location i stored in a buffer memory, not shown, is accessed to the received data input unit shown in FIG. 1 and thereby added with the data stored in the S0 register 15.

When such processing is carried out at the completion of the calculation, data that had been error-corrected is left in the S0 register 15. Then, error-corrected data DT is output and the error correction is completed.

Figure 2:
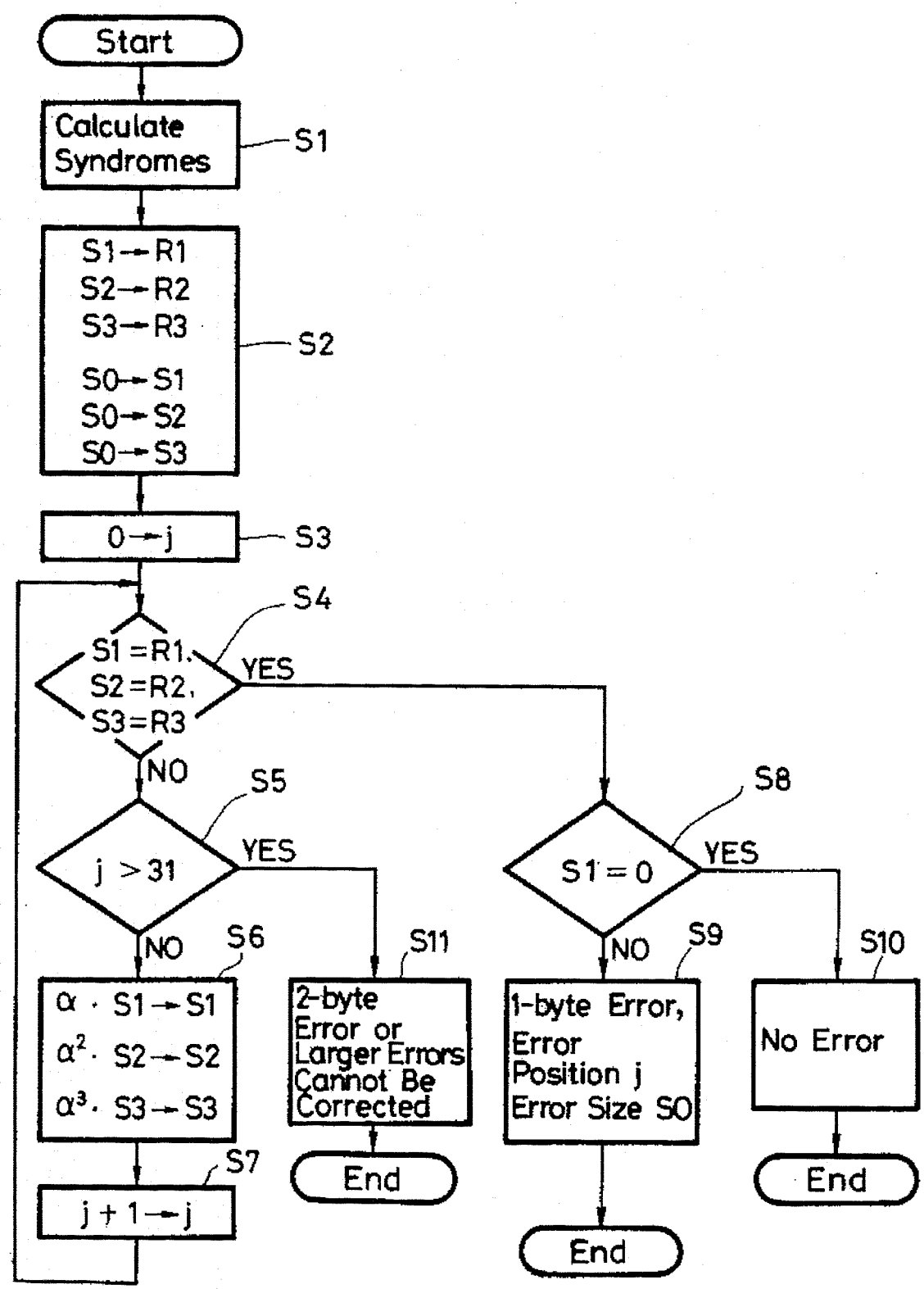
FIG. 2 is a flowchart of an error correction algorithm according to the present invention.
Figure 3:
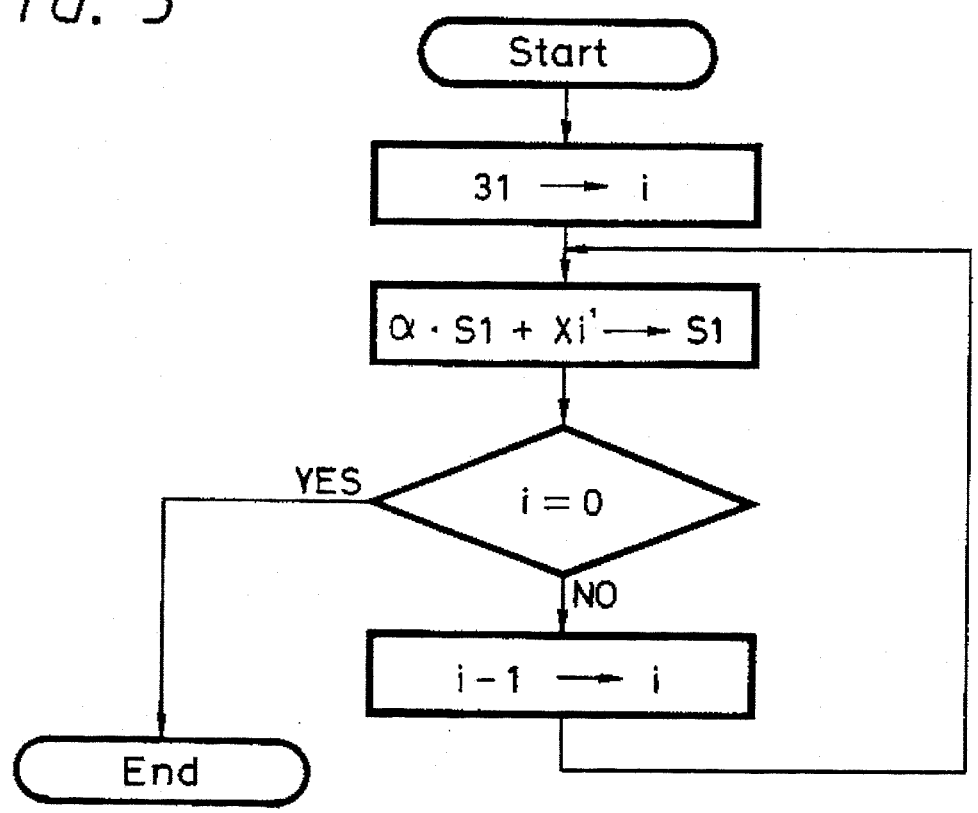
FIG. 3 is a flowchart of a calculation algorithm of syndrome S1.
Figure 4:
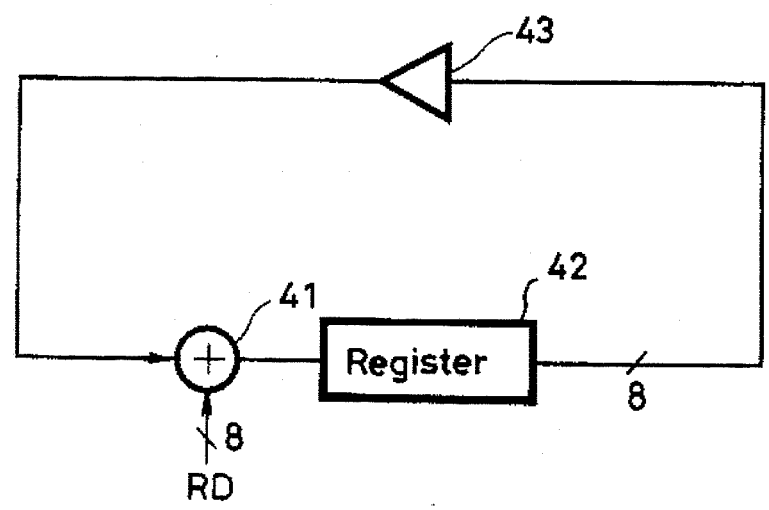
FIG. 4 is a block diagram showing an example of a calculation circuit for calculating syndrome S1.
Figure 5:
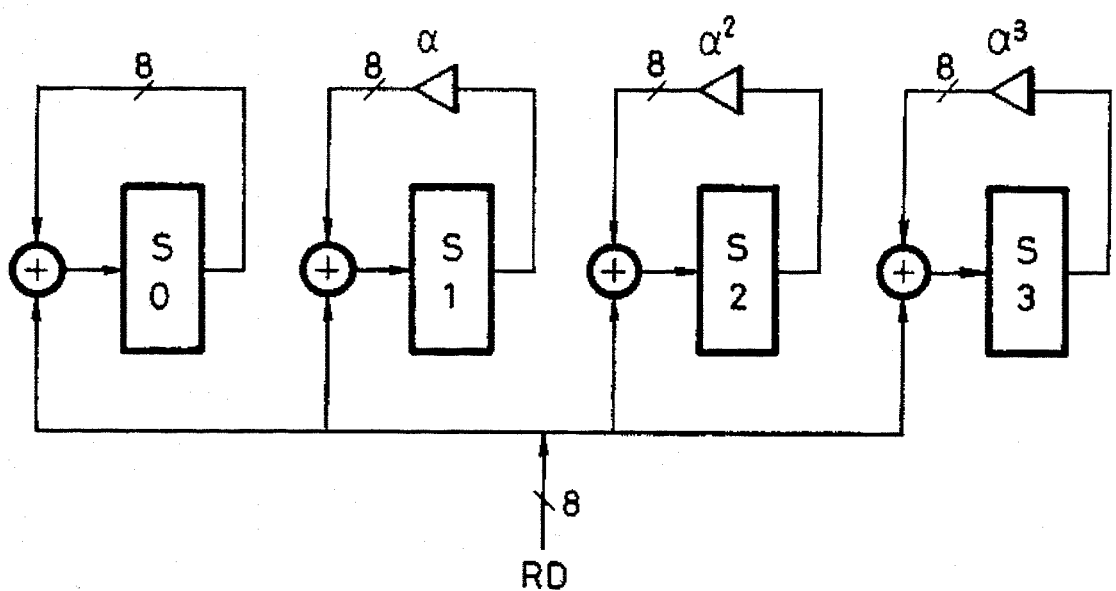
FIG. 5 is a block diagram showing an example of a calculation circuit for calculating syndromes S0 to S4.
Figure 6:
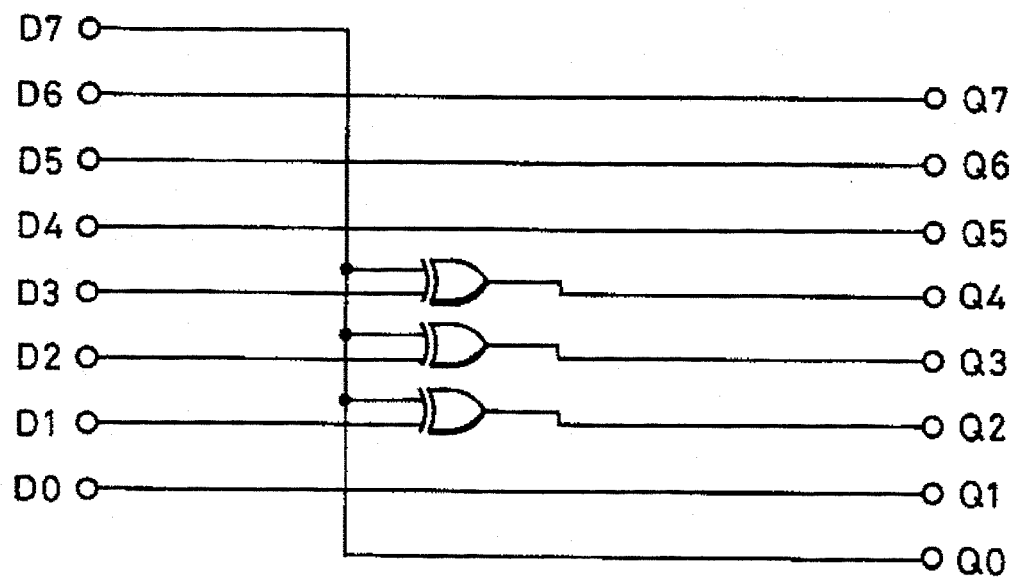
FIG. 6 is a block diagram showing an example of a multiply-by-power α circuit.
Figure 7:
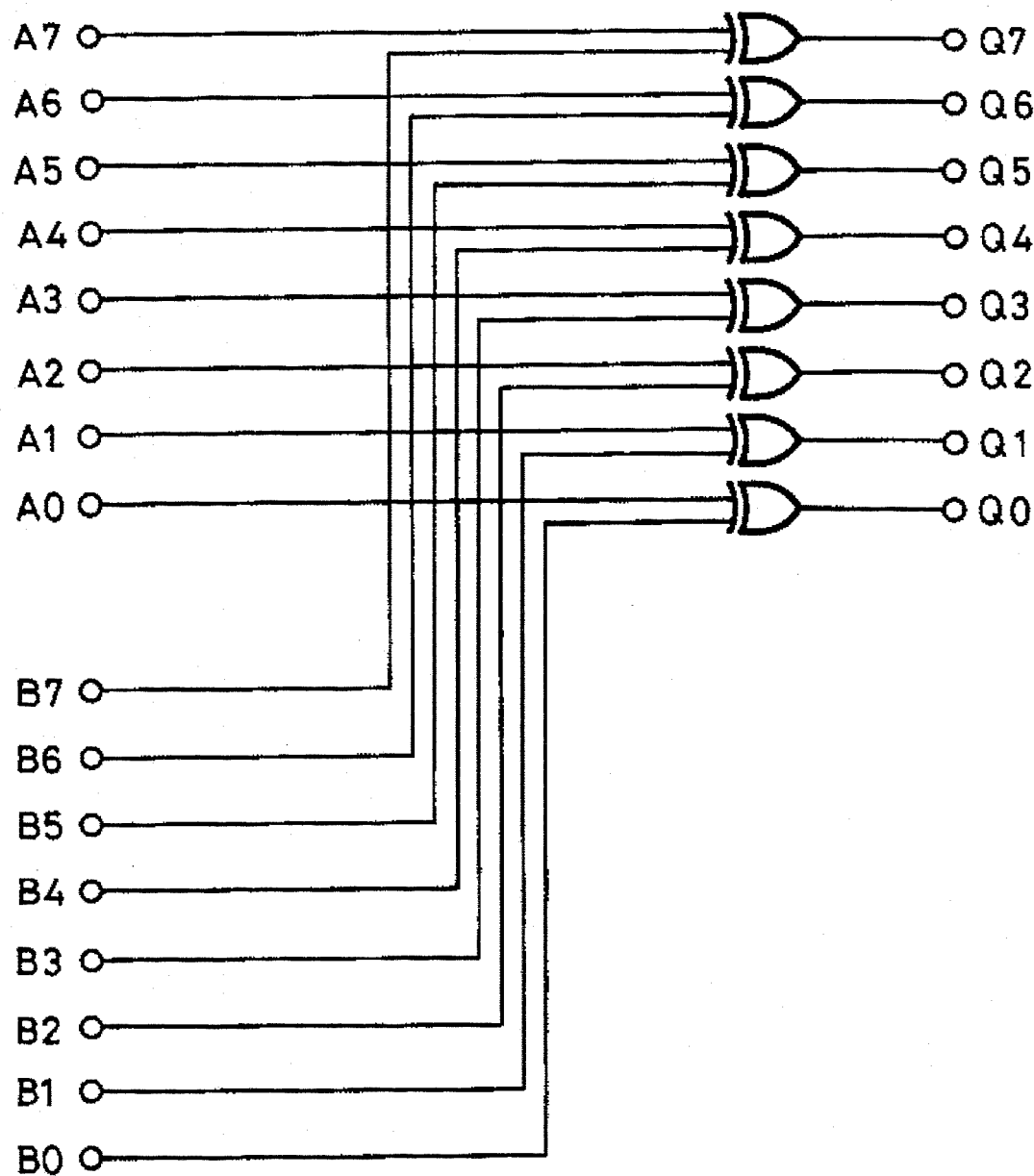
FIG. 7 is a block diagram showing an example of an adder which carries out addition on the Galois field.

The algorithm according to the present invention will be described next with reference to a flowchart of FIG. 2.

Initially, syndromes are calculated by the adders 11 to 14, the syndrome registers [S0 to S3] 15 to 18, the multiply-by-power $\alpha$ circuit 19, the multiply-by-power $\alpha^2$ circuit 20 and the multiply-by-power $\alpha^3$ circuit 21 (at step S1).

Assuming now that ith received data, for example, is erroneous by the amount $e_i$, then [Equation 5] yields $S0=e_i$, $S1=e_i\alpha^i$, $S2=e_i\alpha^{1i}$ and $S3=e_i\alpha^{3i}$.

Then, respective data stored in the syndrome registers {S1 to S3} 16 to 18 are stored in data registers [R1 to R3] 22 to 24 and data stored in the syndrome register [S0] 15 is stored in the syndrome registers [S1 to S3], respectively (at step S2).

Therefore, values of the syndrome registers [S0 to S3] 15 to 18 are $S0=S1=S2=S3=e_i$, $R1=e_i\alpha^i$, $R2=e_i\alpha^{21}$, $R3=e_i\alpha^{3i}$.

Subsequently, the counter 29 is reset to "0" (at step S3), and it is determined whether or not S1=R1, S2=R2, S3=R3 are established in the syndrome registers 16 to 18 and the data registers 22 to 24 (at step S4).

If 0th received data ($x_0'$) is erroneous, then the above-mentioned three conditions in the S registers and the R registers are all agreed.

If the received data is not erroneous, then the above-mentioned conditions also are established. In this case, since S0=0, it can be determined whether or not the received data is erroneous, as will be described later on.

If it is determined in step S4 that the above-mentioned conditions are not established, so long as $j \leq 31$ is established (at step S5), $\alpha \cdot S1 \to S1$, $\alpha^2 \cdot S2 \to S2$, $\alpha^3 \cdot S3 \to S3$ are calculated (at step S6). Then, the count value j of the counter 29 is incremented by one (step S7), and the processing returns to step S4.

Calculations in step S6 can be realized only by inputting "0" as received data.

As a result of this calculation, the values of the syndrome registers 16 to 18 are $S1=\alpha e_i$, $S2=\alpha^2 e_i$, $S3=\alpha^3 e_i$.

It is determined one more time whether or not the conditions, S1=R1, S2=R2, S3=R3 are established (at step S4).

If the first ($x_1'$) data of the received data is erroneous, then these conditions should be established. If these conditions are not established, steps S6 and S7 are executed one more time.

If calculation is carried out j times, then the syndrome registers 16 to 18 generate $S1=\alpha^j e_i$, $S2=\alpha^{2j} e_i$, $S3=\alpha^{3j} e_i$. When j is agreed with i (number of erroneous received data), S1=R1, S2=R2, S3=R3.

Specifically, such calculation is repeated several times. When it is determined in step S4 that S1=R1, S2=R2, S3=R3 are established, so long as the condition, $S1 \neq 0$ is established (step S8), the count value j of the counter 29 is set to the number of erroneous data, and the error amount is set to the value of the syndrome register [S0] 15 (at step S9).

If S0=0 in step S8, then it is determined that received data contains no error (at step S10).

If it is determined in step S5 that the S register and the R register are not agreed with each other even though the count value j of the counter 29 exceeds 31, then it is determined that received data contains 2-byte error or greater. Then, such received data is treated as data that cannot be corrected (at step S11).

As set out in detail, according to the embodiment of the present invention, the syndromes are calculated by the syndrome registers S0, S1 to S(n-1). After the syndrome registers had finished calculating the syndromes, if error is the single-error, then the value of the syndrome register S0 is loaded to the syndrome registers S1 to S(n-1) and the values of the syndrome registers S1 to S(n-1) are loaded to the data registers R1 to R(n-1), respectively. Multiplications of powers $\alpha, \ldots, \alpha^{(n-1)}$ are repeated by using the syndrome registers S1 to S(n-1) until the values of the syndrome registers S1 to S(n-1) and the values of the data registers R1 to R(n-1) are agreed. Count operation is executed in synchronism with the multiplications of powers. The count value obtained when it is detected that the values of the syndrome registers and the values of the data registers are agreed is set to the location of data containing error and the value of the syndrome register S0 is set to the error amount. Then, error correction is carried out on the basis of the location and the error amount. Therefore, the single-error can be detected and corrected by the circuit arrangement of the extremely small circuit scale composed of n syndrome registers indispensable to calculation of syndromes, (n-1) data registers, one counter and coincidence detecting circuits, each of which is added to the syndrome registers.

While the present invention is applied to the apparatus for reproducing the CD with the signal format having four syndromes (S0 to S3) as described above, the present invention is not limited thereto and can be applied to the whole field of digital data processing apparatus. By way of example, when the present invention is applied to a reproducing apparatus for reproducing a DAT with a signal format having six syndromes, error can be detected and corrected similarly as described above by increasing the number of syndrome registers and data registers in response to the number of syndromes.

What is claimed is:

1. A method for correcting errors present in data reproduced from a recording medium comprising the steps of:

calculating n syndromes, wherein n is a positive integer, determined by a number of parity words added to said reproduced data and storing in a first syndrome register a syndrome representing an error amount present in said reproduced data if said error amount comprises a single-error and storing other syndromes in (n-1) syndrome registers, respectively, said (n-1) syndrome registers not including said first syndrome register;

loading a value stored in said first syndrome register in said (n-1) syndrome registers and values stored in said (n-1) syndrome registers in (n-1) data registers, respectively, after calculation of syndromes is ended;

repetitively multiplying the values stored in said (n-1) syndrome registers by a corresponding plurality of multiplication factors, said plurality of multiplication factors ranging from a factor of $\alpha$ to a factor of $\alpha^{(n-1)}$, until the respective values stored in said (n–1) syndrome registers and the respective values stored in said (n–1) data registers are equal, wherein $\alpha$ is a root of a generator polynomial on Galois field and executing a count operation in synchronism with said repetitive multiplying step in which a count value is incremented by a predetermined amount for every multiplying step;

designating said count value as a data location of said errors present in said reproduced data when the values of said (n–1) syndrome registers and the values of said (n–1) data registers are equal and designating the value stored in said first syndrome register as said error amount; and correcting said errors on the basis of said data location and said error amount.

2. The method of claim 1, wherein n equals 4.

3. The method of claim 2, wherein said recording medium is a compact disc.

4. The method of claim 1, wherein n equals 6.

5. The method of claim 4, wherein said recording medium is a digital audio tape.

6. An error correction circuit for correcting errors present in data reproduced from a recording medium comprising:

n syndrome registers, wherein a first of said n syndrome registers calculates and stores a first syndrome from said reproduced data, said first syndrome representing an error amount of a single-error present in said reproduced data, and wherein (n–1) syndrome registers calculates and stores (n–1) syndromes, said (n–1) syndrome registers not including said first of said n syndrome registers and said (n–1) syndromes not including said first syndrome;

(n–1) data registers, in communication with said (n–1) syndrome registers, for storing values stored in said (n–1) syndrome registers;

(n–1) coincidence detecting circuits, in communication with said (n–1) syndrome registers and in communication with said (n–1) data registers, for detecting whether or not the values stored in said (n–1) syndrome registers and the values stored in said (n–1) data registers are equal; and (n–1) multiplication circuits, in communication with said (n–1) syndrome registers and in communication with said (n–1) coincidence detecting circuits, for repetitively multiplying the values stored in said (n–1) syndrome registers by a corresponding plurality of multiplication factors until the values stored in said (n–1) syndrome registers and the values stored in said (n–1) data registers are equal, said plurality of multiplication factors ranging from a factor of $\alpha$ to a factor of $\alpha^{(n-1)}$, wherein $\alpha$ is a root of a generator polynomial on Galois field;

a counter, in communication with said (n–1) multiplication circuits and in communication with said (n–1) coincidence detecting circuits, for incrementing a count value by a predetermined amount until the values stored in said (n–1) syndrome registers and the values stored in said (n–1) data registers are equal, wherein said errors present in said reproduced data are corrected on the basis of said count value of said counter and on the basis of said first syndrome.

7. The error correction circuit of claim 6, wherein n equals 4.

8. The error correction circuit of claim 7, wherein said recording medium is a compact disc.

9. The error correction circuit of claim 2, wherein n equals 6.

10. The error correction circuit of claim 9, wherein said recording medium is a digital audio tape.

* * * * *